United States Patent
Huang et al.

(10) Patent No.: US 8,952,945 B2
(45) Date of Patent: Feb. 10, 2015

(54) DISPLAY AND GATE DRIVER THEREOF

(71) Applicant: AU Optronics Corporation, Hsin-Chu (TW)

(72) Inventors: Kuan-Chun Huang, Hsin-Chu (TW); Chen-Yuan Lei, Hsin-Chu (TW); Liang-Chen Lin, Hsin-Chu (TW); Pi-Chun Yeh, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 136 days.

(21) Appl. No.: 13/798,441

(22) Filed: Mar. 13, 2013

(65) Prior Publication Data

US 2014/0035889 A1 Feb. 6, 2014

(30) Foreign Application Priority Data

Aug. 6, 2012 (TW) .............................. 101128325 A

(51) Int. Cl.
*G09G 3/00* (2006.01)
*H03K 17/06* (2006.01)
*G09G 3/36* (2006.01)

(52) U.S. Cl.
CPC ................ *G09G 3/00* (2013.01); *H03K 17/063* (2013.01); *G09G 3/3674* (2013.01)
USPC .............................. 345/204; 345/87; 327/109

(58) Field of Classification Search
None
See application file for complete search history.

(56) References Cited

U.S. PATENT DOCUMENTS

| | | | | |
|---|---|---|---|---|
| 5,453,757 A * | 9/1995 | Date et al. | ......................... | 345/89 |
| 6,127,998 A * | 10/2000 | Ichikawa et al. | .............. | 345/100 |
| 6,724,361 B1 * | 4/2004 | Washio et al. | ................... | 345/98 |
| 6,724,363 B1 * | 4/2004 | Satoh et al. | .................... | 345/100 |
| 6,897,841 B2 * | 5/2005 | Ino | ................................... | 345/87 |
| 8,023,613 B2 | 9/2011 | Tsai et al. | | |
| 8,089,446 B2 * | 1/2012 | Pak et al. | ....................... | 345/100 |
| 8,542,178 B2 * | 9/2013 | Yoo et al. | ...................... | 345/100 |
| 2002/0044625 A1 * | 4/2002 | Kim et al. | ........................ | 377/54 |
| 2002/0084963 A1 * | 7/2002 | Komiya et al. | ................. | 345/87 |
| 2002/0186183 A1 * | 12/2002 | Akimoto | ......................... | 345/55 |
| 2003/0132906 A1 * | 7/2003 | Tanaka et al. | .................... | 345/89 |
| 2003/0174118 A1 * | 9/2003 | Sato et al. | ...................... | 345/100 |
| 2005/0156862 A1 * | 7/2005 | Hirayama et al. | ............ | 345/100 |
| 2006/0145991 A1 * | 7/2006 | Jang et al. | ....................... | 345/94 |
| 2007/0274433 A1 * | 11/2007 | Tobita | .............................. | 377/64 |
| 2008/0136756 A1 * | 6/2008 | Yeo et al. | ........................ | 345/87 |
| 2009/0002357 A1 * | 1/2009 | John et al. | ...................... | 345/212 |
| 2009/0219274 A1 * | 9/2009 | Li et al. | .......................... | 345/211 |
| 2010/0001941 A1 * | 1/2010 | Shin et al. | ....................... | 345/98 |
| 2010/0079443 A1 * | 4/2010 | Chang et al. | ................... | 345/214 |

(Continued)

FOREIGN PATENT DOCUMENTS

| | | |
|---|---|---|
| CN | 102419949 A | 4/2012 |
| TW | 201040931 | 11/2010 |

*Primary Examiner* — Peter Vincent Agustin
(74) *Attorney, Agent, or Firm* — WPAT, PC; Justin King

(57) ABSTRACT

A display and a gate driver are disclosed herein, in which the gate driver includes a number of gate driving units, and each of the gate driving units includes a control circuit, a boost circuit, a driver output circuit and a voltage stabilized circuit. The control circuit is electrically connected to a previous gate driving unit and a next gate driving unit. The boost circuit is electrically connected to the control circuit for driving the next gate driving unit. The driver output circuit is electrically connected to the boost circuit and a pixel array for driving at least one scan line in the pixel array. The voltage stabilizing circuit is electrically connected to the boost circuit and the driver output circuit.

17 Claims, 8 Drawing Sheets

(56) References Cited

U.S. PATENT DOCUMENTS

2010/0238156 A1* 9/2010 Iwamoto et al. ............. 345/213
2010/0245335 A1  9/2010 Kimura et al.
2012/0075280 A1* 3/2012 Liu et al. ..................... 345/212
2014/0035889 A1* 2/2014 Huang et al. ................ 345/204
2014/0105351 A1* 4/2014 Chan et al. .................... 377/64

* cited by examiner

DISPLAY AND GATE DRIVER THEREOF

RELATED APPLICATIONS

This application claims priority to Taiwan Application Serial Number 101128325, filed month Aug. 6, 2012, which is herein incorporated by reference.

BACKGROUND

1. Technical Field

The present disclosure relates to a driving device. More particularly, the present disclosure relates to a display and a gate driver thereof.

2. Description of Related Art

With the developments of display technologies in recent years, the resolution of display plays a key role. Generally, displays can be categorized into active light-emitting displays, such as cathode-ray tube (CRT) and light-emitting diode (LED) displays, and passive light-emitting displays, such as liquid crystal displays (LCDs).

Compared with conventional CRT displays, LCDs consume less electric power and occupy less space, and thus they have been the mainstream in markets of display. In operation, thin-film transistor (TFT) displays include driving units, such that voltage signals transmitted on data lines are inputted into liquid crystal displaying elements in order to activate pixels. The primary function of the driving units is to output required voltages to the pixels to control the twisting degrees of liquid crystals in the liquid crystal displaying elements. The driving units can be separated into source drivers and gate drivers. The source drivers are configured to arrange inputs of data, and the gate drivers are configured to determine the twist degree and the refresh rate of the liquid crystal displaying elements. However, the conventional gate drivers generally have the following drawbacks: 1. a size of border for metal wiring is difficult to shrink; 2. gate voltages outputted to TFTs are insufficient.

Accordingly, inconveniences and deficiencies apparently exist in the aforementioned gate drivers and are needed to be further addressed. To solve the aforementioned problems, in related arts, efforts to find the solution are tremendous and no suitable solution is completely developed. As a result, how to provide sufficient charging voltages (gate voltages) and reduce circuit layout area is one of the most important issues and also becomes an objective needed to be overcome urgently in the related arts nowadays.

SUMMARY

In one aspect, the present disclosure relates to a gate driver. The gate driver includes a plurality of gate driving units, and each of the gate driving units includes a control circuit, a boost circuit, a driving output circuit and a voltage stabilizing circuit. The control circuit is electrically connected to a previous gate driving unit and a next gate driving unit of the gate driving units. The boost circuit is electrically connected to the control circuit to boost the next gate driving unit. The driving output circuit is electrically connected to the boost circuit and a pixel array and configured for driving at least one scan line in the pixel array. The voltage stabilizing circuit is electrically connected to the boost circuit and the driving output circuit.

In another aspect, the present disclosure relates to a display, and the display includes a plurality of data lines, a plurality of scan lines and a gate driver. The scan lines are interlacing with the data lines. And the gate driver is coupled to the scan lines and configured for sequentially driving the scan lines, wherein the gate driver includes a plurality of gate driving units, and each of the gate driving units includes a control circuit, a boost circuit and a driving output circuit. The control circuit is electrically connected to a previous gate driving unit and a next gate driving unit of the gate driving units the and configured for generating a control signal. The boost circuit is electrically connected to the control circuit and configured for generating a boost signal transmitted to the previous gate driving unit and the next gate driving unit in accordance with the control signal and a first clock signal. The driving output circuit is electrically connected to the boost circuit and at least one scan line of the scan lines and configured for generating at least a scan signal driving a corresponding scan line of the scan lines in accordance with the control signal.

BRIEF DESCRIPTION OF THE DRAWINGS

The disclosure can be more fully understood by reading the following detailed description of the embodiment, with reference made to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples anywhere in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

In the following description and claims, the terms "coupled" and "connected", along with their derivatives, may be used. In particular embodiments, "connected" and "coupled" may be used to indicate that two or more elements are in direct physical or electrical contact with each other, or may also mean that two or more elements may be in indirect contact with each other. "Coupled" and "connected" may still be used to indicate that two or more elements cooperate or interact with each other.

Figure 1:
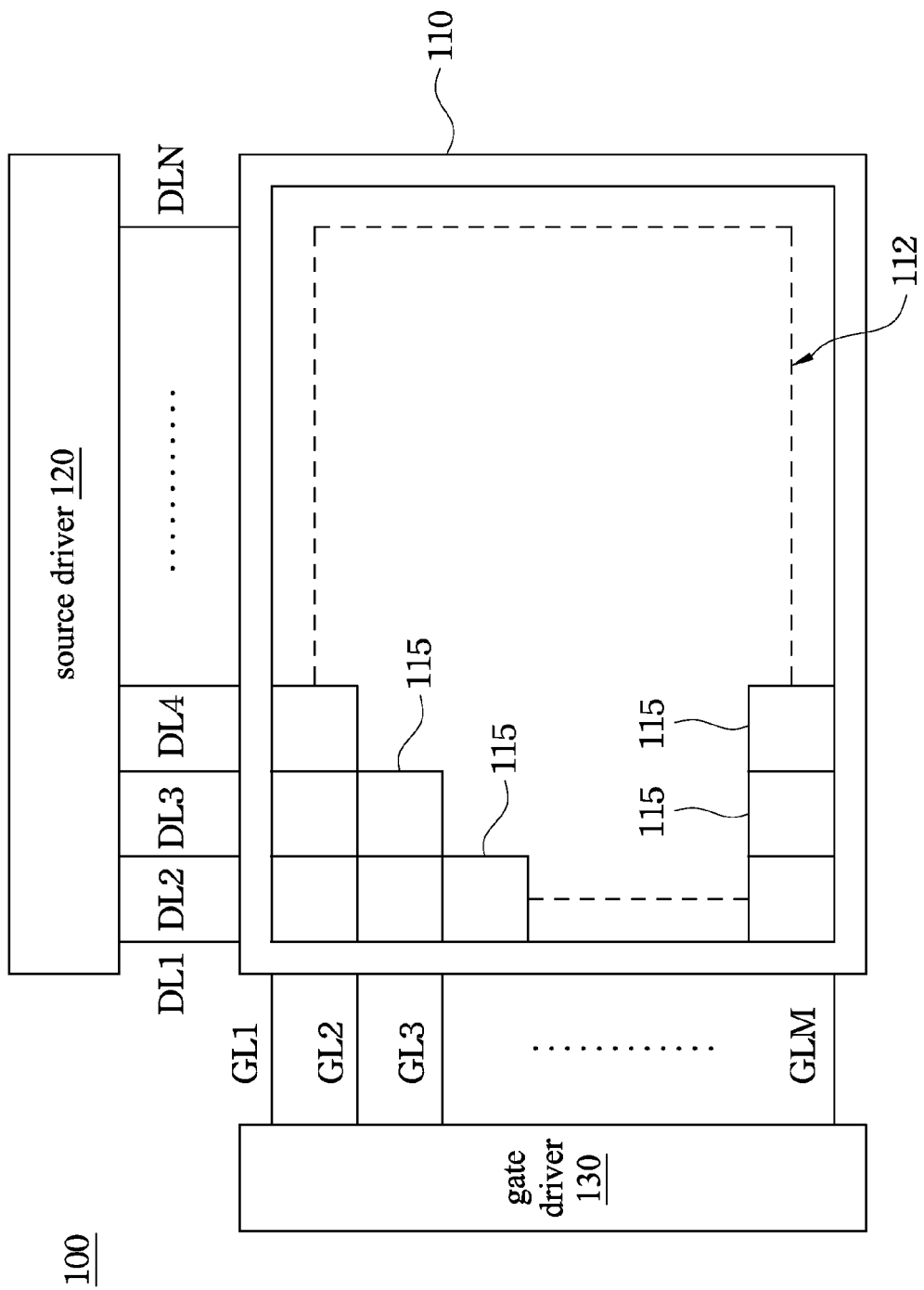
FIG. 1 schematically illustrates a display according to one embodiment of the present disclosure.

FIG. 1 schematically illustrates a display according to one embodiment of the present disclosure. The display 100 includes an image displaying area 110, a source driver 120 and a gate driver 130. The image displaying area 110 includes a pixel array 112 formed by a plurality of data lines (e.g., N data lines DL1~DLN) interlacing with a plurality of scan lines (e.g., M scan lines GL1~GLM), and the image displaying area 110 also includes a plurality of display pixels 115 disposed in the pixel array 112. The source driver 120 is coupled to the data lines DL1~DLN, and the source driver 120 is configured for outputting data signals through the data lines DL1~DLN to the image displaying area 110 for the corresponding display pixels 115. The gate driver 130 is coupled to the scan lines GL1~GLM, and the gate driver 130 is configured for outputting scan signals which sequentially drive the scan lines GL1~GLM and are transmitted through the scan lines GL1~GLM to the image displaying area 110 for the corresponding display pixels 115.

Figure 2:
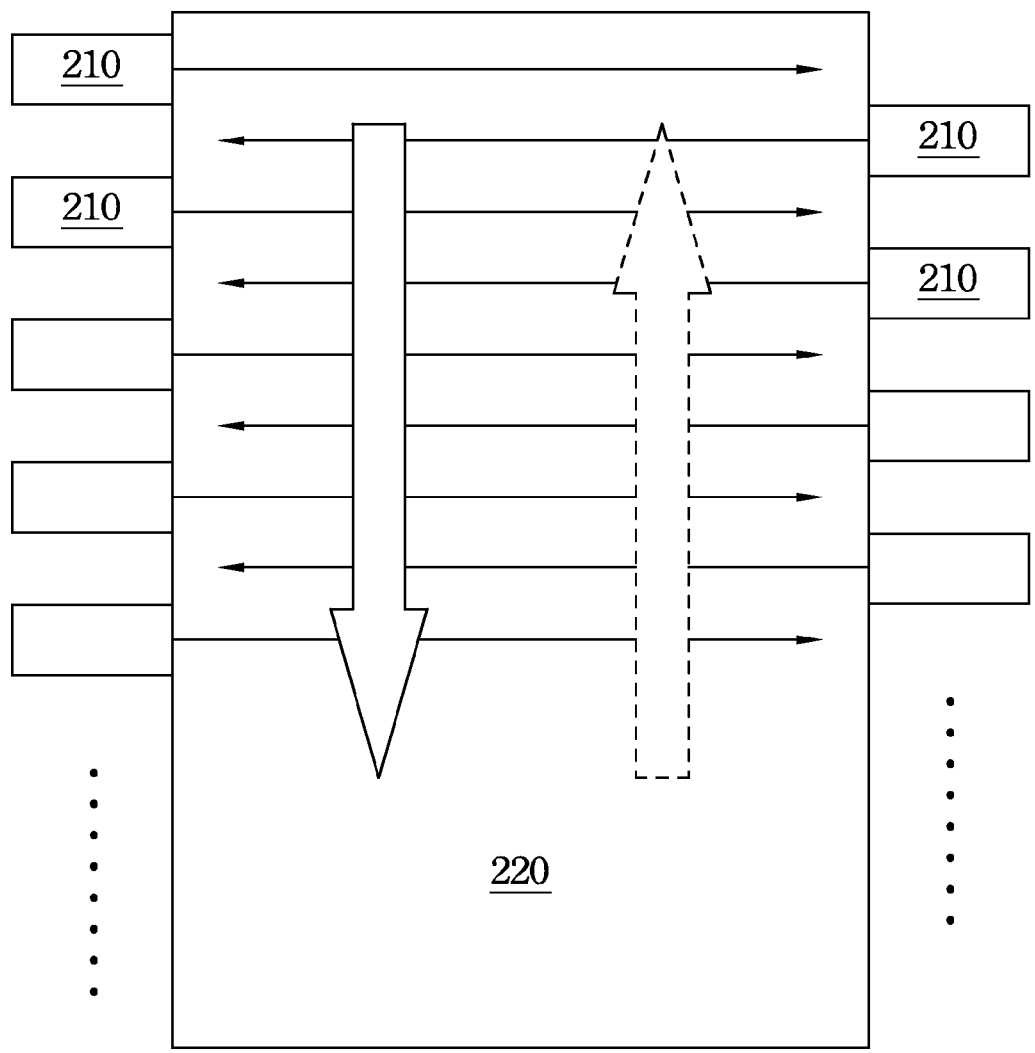
FIG. 2 schematically illustrates an arrangement of an image displaying area and a gate driver in a display according to one embodiment of the present disclosure.

FIG. 2 schematically illustrates an arrangement of an image displaying area and a gate driver in a display according to one embodiment of the present disclosure, in which the arrangement of the image displaying area and the gate driver in FIG. 2 may be applied in the display 100 shown in FIG. 1, but it is not limited thereto. As shown in FIG. 2, the gate driver may include a plurality of gate driving units 210, in which a part of the gate driving units 210 are disposed at the left side of the image displaying area 220, and the other part of the gate driving units 210 are disposed at the right side of the image displaying area 220, and the gate driving units 210 at the both sides of the image displaying area 220 output the scan signals alternately to drive the scan lines. In one embodiment, the gate driving units 210 at the both sides of the image displaying area 220 output the scan signals alternately from top to bottom. In another embodiment, the gate driving units 210 at the both sides of the image displaying area 220 output the scan signals alternately from bottom to top. Further, each of the gate driving units 210 at the both sides of the image displaying area 220 may selectively output one or more scan signals according to practical needs. For example, the first gate driving unit 210 of the gate driving units 210 at the left side of the image displaying area 220 may output a first and a third scan signals, the second gate driving unit 210 of the gate driving units 210 at the left side of the image displaying area 220 may output a fifth and a seventh scan signals, and the rest may be deduced by analogy. The first gate driving unit 210 of the gate driving units 210 at the right side of the image displaying area 220 may output a second and a fourth scan signals, and the second gate driving unit 210 of the gate driving units 210 at the right side of the image displaying area 220 may output a sixth and an eighth scan signals, and the rest may be deduced by analogy. According to the foregoing description, from the first to the eighth scan signals may be sequentially outputted.

In practice, the gate driver including the gate driving units 210 may be fabricated in form of a shift register circuit on a substrate (e.g., a glass substrate) and it is known as Gate driver on Array, i.e., GOA.

Figure 3:
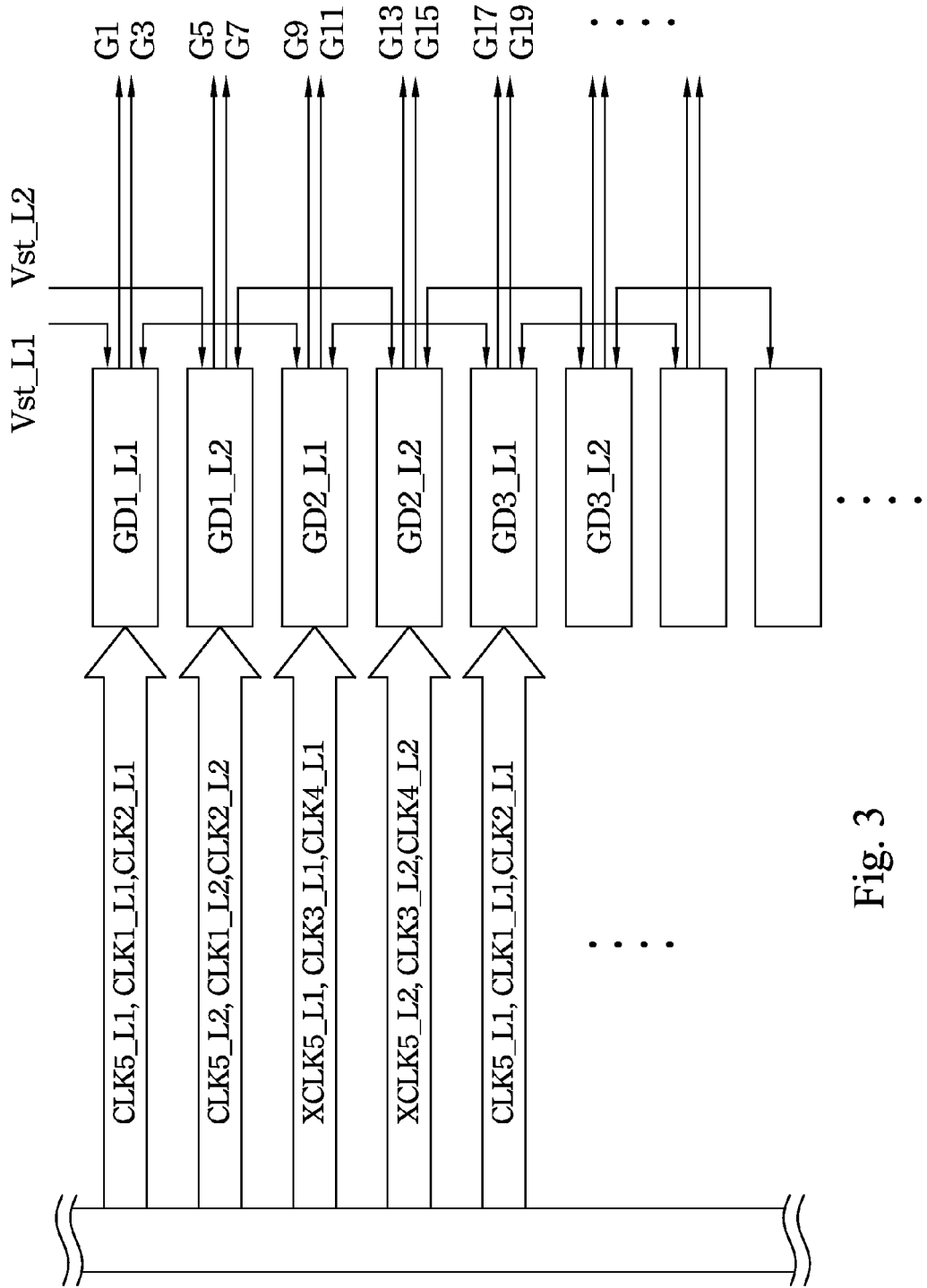
FIG. 3 schematically illustrates an arrangement of gate driving units in a gate driver according to one embodiment of the present disclosure.

FIG. 3 schematically illustrates an arrangement of gate driving units in a gate driver according to one embodiment of the present disclosure, in which the arrangement of the gate driving units in FIG. 3 may be applied in the embodiments as shown in FIG. 1 and FIG. 2, but it is not limited thereto. As shown in FIG. 3, the gate driver includes a plurality of gate driving units (e.g., the gate driving units GD1_L1, GD2_L1, GD3_L1, . . . and GD1_L2, GD2_L2, GD3_L2, . . . , which correspond to the gate driving units 210 at one side of the image displaying area 220 in FIG. 2), in which the gate driving units may be spatially arranged at the same side of the image displaying area 220 and may be divided into two groups of serial-connected gate driving units for separately outputting the scan signals (e.g., G1, G3, G5, G7, G9, G11, . . . ) in accordance with corresponding clock signals, and the gate driving units 210 at the other side of the image displaying area 220 in FIG. 2 (i.e., the gate driving units 210 outputting the scan signals G2, G4, G6, G8, G10, G12, . . . ) are correspondingly disposed at the other side of the image displaying area 220. In addition, the scan signals G1, G2, G3, G4, . . . etc, are generally outputted sequentially to drive the pixels.

For example, the gate driving units GD1_L1, GD2_L1, GD3_L1, . . . are serially connected, in which the gate driving unit GD1_L1 operates in accordance with the clock signals CLK5_L1, CLK1_L1 and CLK2_L1 and the gate driving unit GD1_L1 outputs the scan signals G1 and G3, and the serial-connected gate driving unit GD2_L1 operates in accordance with the clock signals XCLK5_L1, CLK3_L1 and CLK4_L1 and the serial-connected gate driving unit GD2_L1 outputs the scan signals G9 and G11. On the other hand, the gate driving units GD1_L2, GD2_L2, GD3_L2, . . . are serially connected, in which the gate driving unit GD1_L2 operates in accordance with the clock signals CLK5_L2, CLK1_L2 and CLK2_L2 and the gate driving unit GD1_L2 outputs the scan signals G5 and G7, and the serial-connected gate driving unit GD2_L2 operates in accordance with the clock signals XCLK5_L12, CLK3_L2 and CLK4_L2 and the serial-connected gate driving unit GD2_L2 outputs the scan signals G13 and G15. In one embodiment, the clock signals CLK1_L1, CLK2_L1, CLK3_L1 and CLK4_L1 have a phase difference between each other, and the clock signals CLK1_L2, CLK2_L2, CLK3_L2 and CLK4_L2 have a phase difference between each other, and the clock signal CLK5_L1 has a phase opposite to a phase of the clock signal XCLK5_L1, and the clock signal CLK5_L2 has a phase opposite to a phase of the clock signal XCLK5_L2.

Moreover, the embodiment shown in FIG. 3 only exemplarily illustrates the gate driving units at the same side of the image displaying area 220; in other words, the gate driver also includes a plurality of gate driving units at the other side of the image displaying area 220, and the arrangement of the gate driving units at the other side of the image displaying area 220 is similar to the embodiment shown in FIG. 3, and the gate driving units at the other side of the image displaying area 220 may similarly output the scan signals (e.g., the scan signals G2, G4, G6, G8, G10, G12. . . ) in accordance with the corresponding clock signals.

Figure 4:
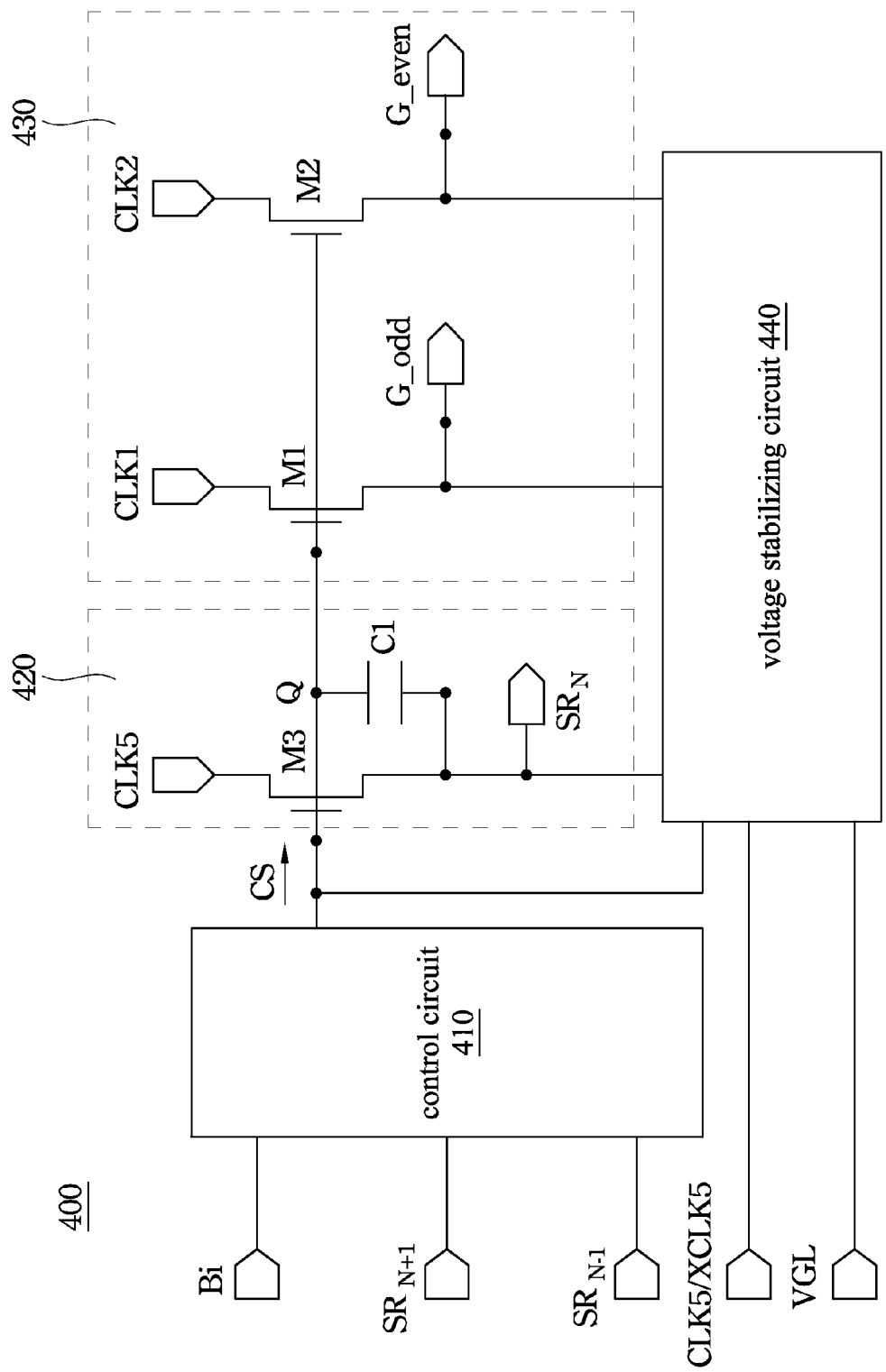
FIG. 4 schematically illustrates a gate driving unit of a gate driver according to one embodiment of the present disclosure.

FIG. 4 schematically illustrates a gate driving unit of a gate driver according to one embodiment of the present disclosure. The gate driving unit 400 may be applied in the embodiment shown in FIG. 3, but it is not limited thereto. For convenience of illustration, the following description takes the N-th gate driving unit (i.e., GDN_L1) as an example.

The gate driving unit 400 includes a control circuit 410, a boost circuit 420, a driving output circuit 430 and a voltage stabilizing circuit 440. The control circuit 410 is electrically connected to a previous gate driving unit (e.g., gate driving unit GD(N−1)_L1) and a next gate driving unit (e.g., gate driving unit GD(N+1)_L1), and the control circuit 410 is configured for receiving an input signal Bi and boost signals $SR_{N-1}$ and $SR_{N+1}$ outputted by the previous and the next gate driving units respectively, so as to generate a control signal CS. The boost circuit 420 is electrically connected to the control circuit 410, and the boost circuit 420 is configured for generating a boost signal $SR_N$ of the present gate driving unit in accordance with the control signal CS and a clock signal CLK5 and transmitting the boost signal $SR_N$ to the previous gate driving unit and the next gate driving unit so as to boost the next gate driving unit. The driving output circuit 430 is electrically connected to the boost circuit 420 and the pixel array, or at least one scan line of the scan lines, and the driving output circuit 430 is configured for generating at least one scan signal (e.g., G_odd and G_even) in accordance with the control signal CS to drive a corresponding scan line of the scan lines. The voltage stabilizing circuit 440 is electrically connected to the boost circuit 420 and the driving output circuit 430, and the voltage stabilizing circuit 440 is configured for performing the operations of voltage-stabilizing on the signal outputs of the boost circuit 420 and the driving output circuit 430 in accordance with a voltage stabilizing signal (e.g., clock signals CLK5, XCLK5) and a reference voltage VGL after the boost circuit 420 and the driving output circuit 430 output the boost signal $SR_N$ and the scan signals respectively.

The driving output circuit 430 may include one or more driving transistors, and the driving output circuit 430 is configured for generating the corresponding scan signals in accordance with the control signal CS to drive the corresponding scan lines of the scan lines, in which each of the driving transistors has a first terminal, a second terminal and a control terminal, and the control terminal of the driving transistors are configured for receiving the control signal CS, the first terminals of the driving transistors are configured for receiving different clock signals, respectively, and the second terminals of the driving transistors are connected to the different scan lines, respectively.

As shown in FIG. 4, the driving output circuit 430 includes driving transistors M1 and M2. The driving transistor M1 has a first terminal, a second terminal and a control terminal, in which the control terminal of the driving transistor M1 is electrically connected to the control circuit 410, the first terminal of the driving transistor M1 is configured for receiving a clock signal CLK1, and the second terminal of the driving transistor M1 is electrically connected to the voltage stabilizing circuit 440 and a corresponding scan line and the second terminal of the driving transistor M1 is configured for outputting a scan signal G_odd. The driving transistor M2 has a first terminal, a second terminal and a control terminal, in which the control terminal of the driving transistor M2 is electrically connected to the control circuit 410, the first terminal of the driving transistor M2 is configured for receiving a clock signal CLK2, and the second terminal of the driving transistor M2 is electrically connected to the voltage stabilizing circuit 440 and a corresponding scan line and the second terminal of the driving transistor M2 is configured for outputting a scan signal G_even.

Specifically, the gate driving unit 400 may correspond to the gate driving units shown in FIG. 3, e.g., GD1_L1, GD1_L2, GD2_L1, . . . etc. When the gate driving unit 400 corresponds to a gate driving unit, for example, GD1_L1 shown in FIG. 3, the clock signals CLK1, CLK2 and CLK5 may correspond to the signals CLK1_L1, CLK2_L1 and CLK5_L1 shown in FIG. 3 respectively, and the scan signals G_odd and G_even may correspond to the signals G1 and G3 shown in FIG. 3 respectively. For example, when the gate driving unit 400 is the gate driving unit GD1_L1 shown in FIG. 3, the driving transistors M1 and M2 may be configured for receiving the clock signals CLK1_L1 (CLK1) and CLK2_L1 (CLK2) respectively and outputting the clock signals CLK1_L1 (CLK1) and CLK2_L1 (CLK2) as the scan signals G1 (G_odd) and G3 (G_even) respectively in accordance with the control signal CS.

It should be noted that the driving output circuit 430 shown in FIG. 4 is merely for purposes of exemplary illustration and is not intended to limit the present disclosure; that is, the driving output circuit 430 may only include a single driving transistor, or the driving output circuit 430 may include more than two driving transistors. In other words, without departing from the spirit and to scope of the novel concepts of the present disclosure, persons skilled in the art can utilize the driving circuit 430 with a different number of driving transistors according to practical needs.

Further, the boost circuit 420 includes an output transistor M3 and a capacitor C1. The output transistor M3 has a first terminal, a second terminal and a control terminal, in which the control terminal of the output transistor M3 is electrically connected to the control circuit 410, the first terminal of the output transistor M3 is configured for receiving the clock signal CLK5, and the second terminal of the output transistor M3 is electrically connected to the voltage stabilizing circuit 440 and the previous and the next gate driving units and the second terminal of the output transistor M3 is configured for outputting the boost signal $SR_N$ and transmitting the boost signal $SR_N$ to the previous and the next gate driving units. The capacitor C1 has a first terminal and a second terminal, in which the first terminal of the capacitor C1 is electrically connected to the second terminal of the output transistor M3 which is connected to the voltage stabilizing circuit 440, and the second terminal (i.e., a node Q) of the capacitor C1 is electrically connected to the control terminals of the driving transistors M1, M2 and the output transistor M3. And the capacitor C1 may be configured for storing a voltage corresponding to a level of the control signal CS, such that the voltage level of the node Q may be increased up to a certain voltage level by the stored voltage of the capacitor C1 according to the control signal CS in order that the ON-state of the driving transistors M1, M2 and the output transistor M3 might be enhanced.

In the present embodiment, the capacitor C1 has a capacitance larger than a parasitic capacitance of each of the driving transistors M1 and M2. Specifically, there may exist parasitic capacitances between the control terminals and the output terminals of the driving transistors M1 and M2, and the capacitance of the capacitor C1 is larger than the parasitic capacitances existing in the driving transistors M1 and M2. Therefore, the voltage level of the node Q may be first increased up to the certain voltage level almost by the voltage stored in the capacitor C1, and then the voltage level of the node Q is further increased by the output transistor M3 when the clock signal CLK5 is inputted.

To be understood in the aforementioned embodiments, the boost signal $SR_N$ and the scan signals G_odd and G_even are outputted by the corresponding transistors separately. As a result, it may be avoided that operations of boosting the next gate driving unit and driving the scan lines interfere with each other when the boost signal and the scan signal are outputted by the same transistor (or when an output of a single transistor is used as the boost signal and the scan signal at the same time), such that the ability to drive the scan lines is declined. Therefore, the boost signal $SR_N$ and the scan signals G_odd and G_even are outputted by the corresponding transistors separately, resulting in an enhanced driving ability to drive the scan lines and also an enhanced boosting ability to boost the next gate driving unit by the boost signal $SR_N$ in order that interferences on boosting ability might be avoided.

Figure 5:
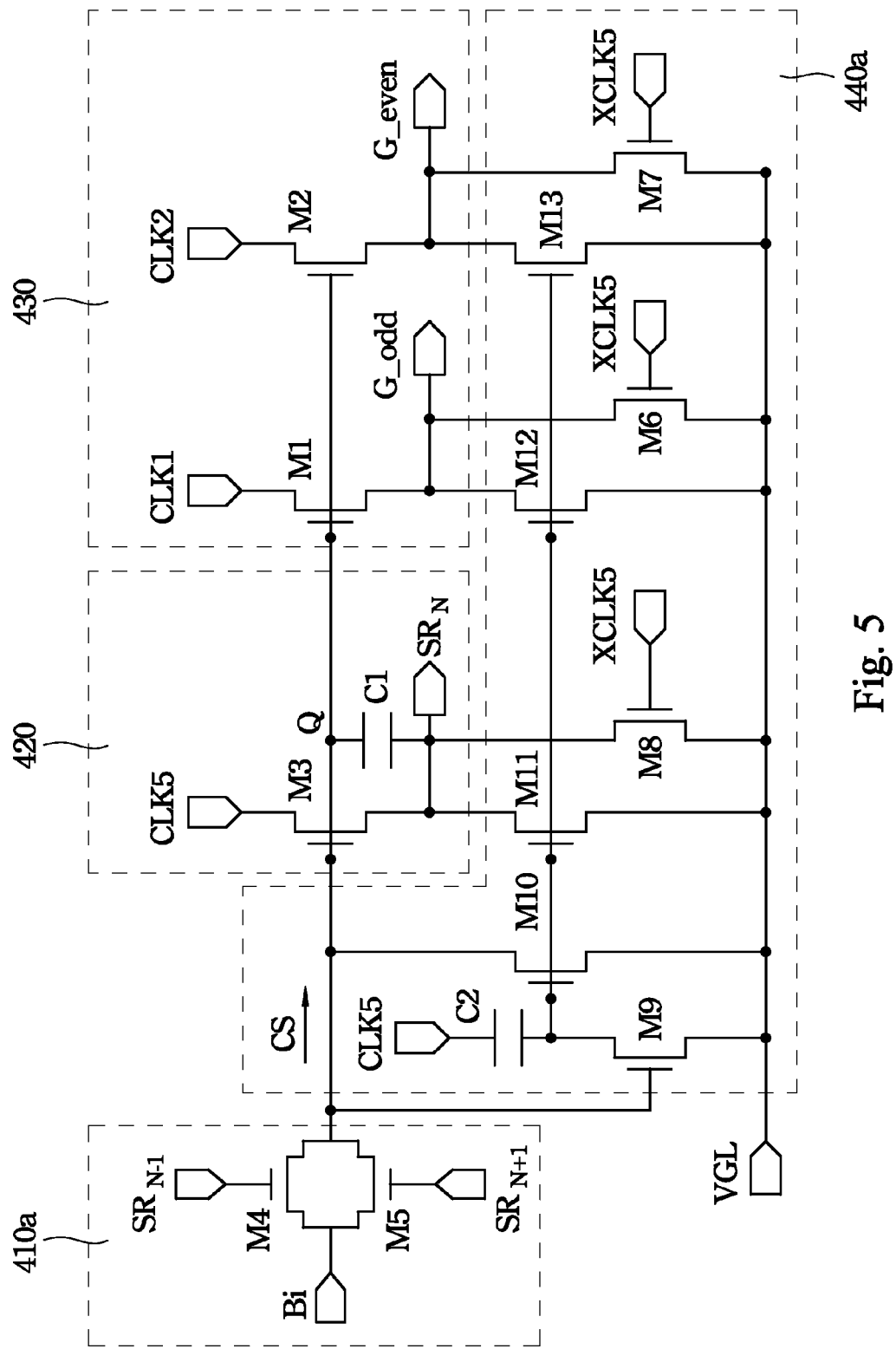
FIG. 5 schematically illustrates a gate driving unit according to one embodiment of the present disclosure.

FIG. 5 schematically illustrates a gate driving unit according to one embodiment of the present disclosure. In comparison with FIG. 4, the control circuit 410 and the voltage stabilizing circuit 440 in FIG. 4 may be exemplarily regarded as the embodiment shown in FIG. 5. The control circuit 410a in the to present embodiment may further include control transistors M4 and M5. The control transistor M4 has a first terminal, a second terminal and a control terminal, in which the control terminal of the control transistor M4 is connected to the previous gate driving unit and the control terminal of the control transistor M4 is configured for receiving the boost signal $SR_{N-1}$ outputted by the previous gate driving unit, the first terminal of the control transistor M4 is configured for receiving the input signal Bi, and the second terminal of the control transistor M4 is connected to the control terminal of the output transistor M3. The control transistor M5 has a first terminal, a second terminal and a control terminal, in which the control terminal of the control transistor M5 is connected to the next gate driving unit and the control terminal of the control transistor M5 is configured for receiving the boost signal $SR_{N+1}$ outputted by the next gate driving unit, the first terminal of the control transistor M5 is configured for receiving the input signal Bi, and the second terminal of the control transistor M5 is connected to the control terminal of the output transistor M3.

In addition, in comparison with FIG. 4, the voltage stabilizing circuit 440a in the present embodiment may further include transistors M6, M7 and M8 each configured for performing the operations of voltage-stabilizing on the boost circuit 420 and the driving output circuit 430 respectively in accordance with the clock signal XCLK5. The transistor M6 has a first terminal, a second terminal and a control terminal, in which the control terminal of the transistor M6 is configured for receiving the clock signal XCLK5, the first terminal of the transistor M6 is connected to the second terminal, which is configured for outputting the scan signal G_odd, of the driving transistor M1, and the second terminal of the transistor M6 is connected to the reference voltage VGL. The transistor M7 has a first terminal, a second terminal and a control terminal, in which the control terminal of the transistor M7 is configured for receiving the clock signal XCLK5, the first terminal of the transistor M7 is connected to the second terminal, which is configured for outputting the scan signal G_even, of the driving transistor M2, and the second terminal of the transistor M7 is connected to the reference voltage VGL. The transistor M8 has a first terminal, a second terminal and a control terminal, in which the control terminal of the transistor M8 is configured for receiving the clock signal XCLK5, the first terminal of the transistor M8 is connected to the second terminal, which is configured for outputting the boost signal $SR_N$, of the output transistor M3, and the second terminal of the transistor M8 is connected to the reference voltage VGL.

Moreover, in comparison with FIG. 4, the voltage stabilizing circuit 440a in the present embodiment may further include transistors M9, M10, M11, M12 and M13 each configured for performing the operations of voltage-stabilizing on the boost circuit 420 and the driving output circuit 430 respectively. The transistor M9 has a first terminal, a second terminal and a control terminal, in which the control terminal of the transistor M9 is connected to the second terminals of control transistors M4 and M5, the first terminal of the transistor M9 is configured for receiving the clock signal CLK5 through a capacitor C2, and the second terminal of the transistor M9 is connected to the reference voltage VGL. The transistor M10 has a first terminal, a second terminal and a control terminal, in which the control terminal of the transistor M10 is connected to the first terminal of the transistor M9, the first terminal of the transistor M10 is connected to the control terminal of the output transistor M3, and the second terminal of the transistor M10 is connected to the reference voltage VGL. The transistor M11 has a first terminal, a second terminal and a control terminal, in which the control terminal of the transistor M11 is connected to the first terminal of the transistor M9, the first terminal of the transistor M11 is connected to the second terminal, which is configured for outputting the boost signal $SR_N$, of the output transistor M3, and the second terminal of the transistor M11 is connected to the reference voltage VGL. The transistor M12 has a first terminal, a second terminal and a control terminal, in which the control terminal of the transistor M12 is connected to the first terminal of the transistor M9, the first terminal of the transistor M12 is connected to the second terminal, which is configured for outputting the scan signal G_odd, of the driving transistor M1, and the second terminal of the transistor M12 is connected to the reference voltage VGL. The transistor M13 has a first terminal, a second terminal and a control terminal, in which the control terminal of the transistor M13 is connected to the first terminal of the transistor M9, the first terminal of the transistor M13 is connected to the second terminal, which is configured for outputting the scan signal G_even, of the driving transistor M2, and the second terminal of the transistor M13 is connected to the reference voltage VGL.

In practice, the foregoing transistors may be conventional transistors or thin film transistors (TFTs).

Figure 6:
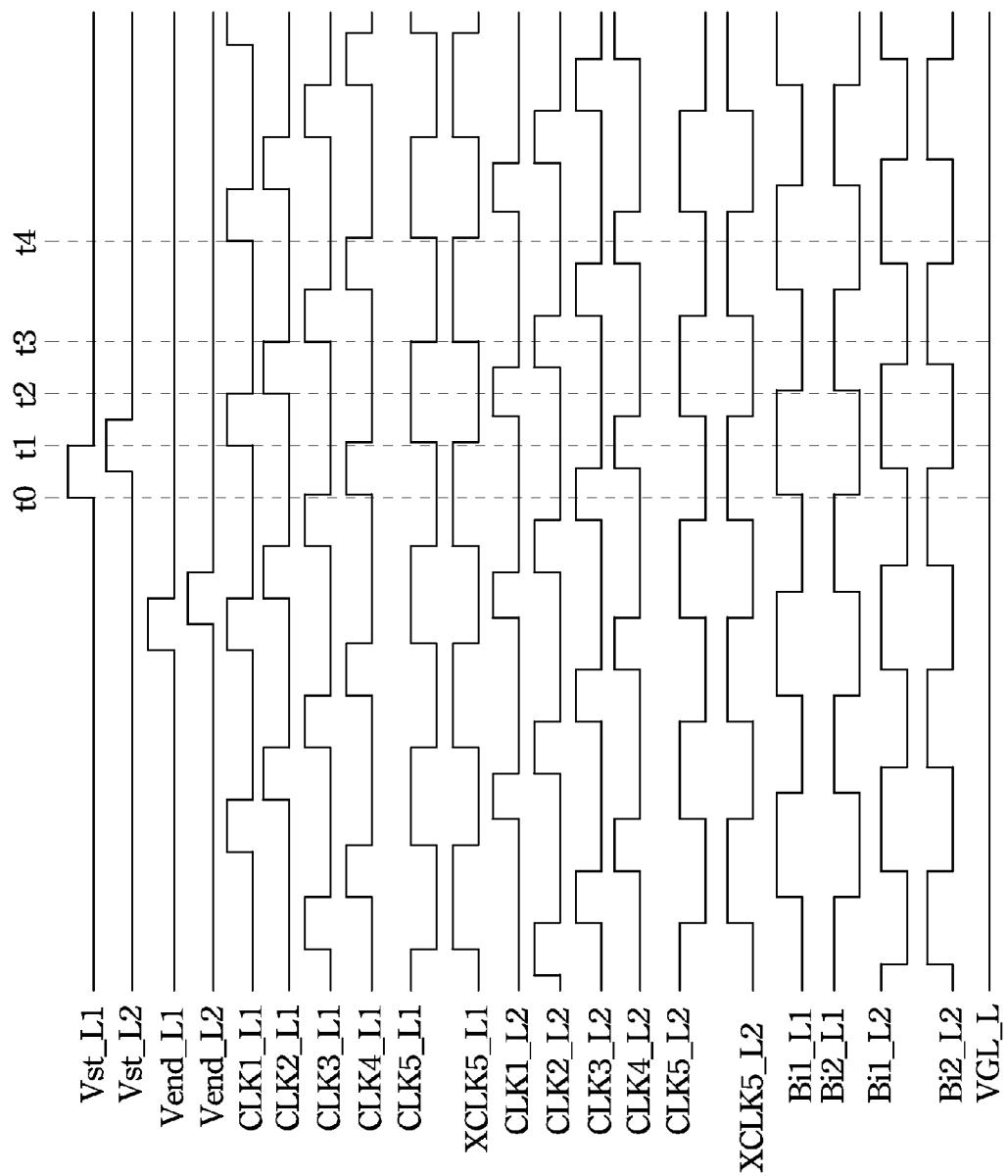
FIG. 6 schematically illustrates a timing diagram for operations of gate driving units as shown in FIG. 3 or FIG. 5 according to one embodiment of the present disclosure.

The following description will illustrate the operations of the gate driving units in conjunction with embodiments. FIG. 6 schematically illustrates a timing diagram for operations of gate driving units as shown in FIG. 3 or FIG. 5 according to one embodiment of the present disclosure. As shown in FIG. 6, the clock signals CLK1_L1, CLK2_L1, CLK3_L1 and CLK4_L1 have a phase difference between each other, and the clock signals CLK1_L2, CLK2_L2, CLK3_L2 and CLK4_L2 have a phase difference between each other. And the clock signal CLK5_L1 has a phase opposite to a phase of the clock signal XCLK5_L1, and the clock signal CLK5_L2 has a phase opposite to a phase of the clock signal XCLK5_L2. In addition, the clock signal CLK5_L1 has a duty period which is a sum of duty periods of the clock signals CLK1_L1 and CLK2_1, and the clock signal CLK5_L2 has a duty period which is a sum of duty periods of the clock signals CLK1_L2 and CLK2_L2.

For purposes of convenient and clear illustration, the following description is made exemplarily in conjunction with the single gate driving unit shown in FIG. 5 and the timing diagram shown in FIG. 6, and the operations of the rest of the gate driving units are similar. The input signal Bi and the clock signals CLK1, CLK2, CLK5 and XCLK5 shown in FIG. 5 in the following description may be exemplarily regarded as the input signal Bi1_L1 and the clock signals CLK1_L1, CLK2_L1, CLK5_L1 and XCLK5_L1 shown in FIG. 6, respectively.

First, at time t0, the input signal Bi1_L1 is changed to a high level, and the transistor M4 receives a boost signal $SR_{N-1}$ outputted by the previous gate driving unit and then the transistor M4 is turned ON, such that the input signal Bi1_L1 is outputted as the control signal CS through the transistor M4 and transmitted to the transistors M3, M1 and M2. Meanwhile, the capacitor C1 may store a voltage corresponding to a level of the control signal CS, such that the voltage level of the node Q may be first increased up to a certain voltage level by the voltage stored in the capacitor C1 according to the control signal CS.

Second, at time t1, the clock signals CLK5_L1 and CLK1_L1 are changed to high levels, such that the voltage level of the node Q is further increased up to a higher voltage level in order that the ON-state of the transistors M3, M1 and M2 might be enhanced, and besides, the boosting ability of the transistor M3 is enhanced by the voltage level of the node Q. Meanwhile, the transistors M3, M1 and M2 are in an ON state, and the clock signal CLK5_L1 is outputted as a boost signal $SR_N$ through the transistor M3 so as to boost the next gate driving unit, and the clock signal CLK1_L1 is outputted as the scan signal G_odd through the transistor M1.

Next, at time t2, the clock signal CLK5_L1 still remains at the high level, and the clock signal CLK2_L1 is changed to the high level, and in the mean time, the transistor M2 still remains in the ON state, and the clock signal CLK2_L1 is outputted as the scan signal G_even through the transistor M2.

Then, at time t3, the clock signal XCLK5_L1 is changed to a high level, such that transistors M6, M7 and M8 are turned ON according to the clock signal XCLK5_L1 in order that the terminals outputting the boost signal $SR_N$ and the scan signals G_odd and G_even might be decreased down to the reference voltage VGL until time t4, whereby the operations of voltage-stabilizing is completed.

The forgoing operations are shown for purposes of exemplary description, and not intended to limit the present disclosure. For example, the input signal Bi and the clock signals CLK1, CLK2, CLK5 and XCLK5 in FIG. 5 may also be exemplarily regarded as the input signal Bi1_L2 and the clock signals CLK1_L2, CLK2_L2, CLK5_L2 and XCLK5_L2 shown in FIG. 6. In another way, the clock signals CLK1 and CLK2 in FIG. 5 may also be exemplarily regarded as the clock signals CLK3_L1 and CLK4_L1 respectively. In other words, the input signal Bi and the clock signals CLK1, CLK2, CLK5 and XCLK5 in FIG. 5 may be regarded as the corresponding signals in FIG. 6, and so it is not further described herein.

In another aspect, without departing from the spirit and scope of the novel concepts of the present disclosure, persons skilled in the art can modify the clock signals in FIG. 6 according to practical needs, such that the gate driving units may output the scan signals driving the scan lines alternately from bottom to top as shown in FIG. 2.

Figure 7:
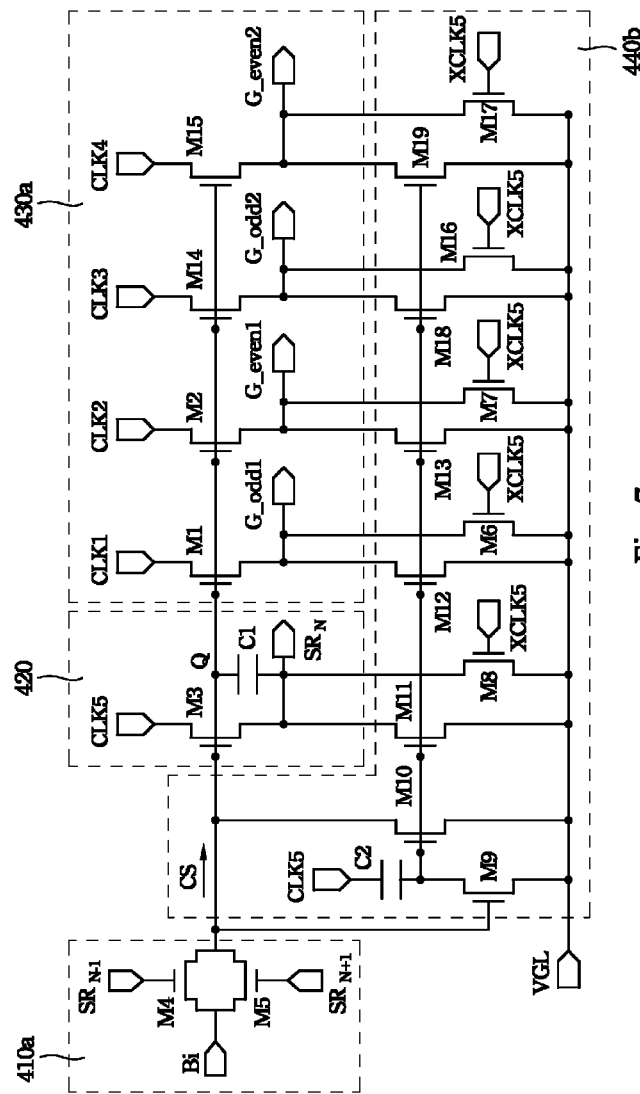
FIG. 7 schematically illustrates a gate driving unit according to one embodiment of the present disclosure.

FIG. 7 schematically illustrates a gate driving unit according to one embodiment of the present disclosure. In comparison with FIG. 5, the driving output circuit 430a further includes driving transistors M14 and M15; that is, the driving output circuit 430a includes the driving transistors M1, M2, M14 and M15. The driving transistors M1 and M2 are configured for outputting the scan signals G_odd1 and G_even1 respectively, which is in a similar way of the embodiment shown in FIG. 5. The driving transistor M14 has a first terminal, a second terminal and a control terminal, in which the control terminal of the driving transistor M14 is electrically connected to a control circuit 410a, the first terminal of the driving transistor M14 is configured for receiving a clock signal CLK3, and the second terminal of the driving transistor M14 is electrically connected to a voltage stabilizing circuit 440b and a corresponding scan line and the second terminal of the driving transistor M14 is configured for outputting a scan signal G_odd2. The driving transistor M15 has a first terminal, a second terminal and a control terminal, in which the control terminal of the driving transistor M15 is electrically connected to the control circuit 410a, the first terminal of the driving transistor M15 is configured for receiving a clock signal CLK4, and the second terminal of the driving transistor M15 is electrically connected to the voltage stabilizing circuit 440b and a corresponding scan line and the second terminal of the driving transistor M15 is configured for outputting a scan signal G_even2. The clock signals CLK1, CLK2, CLK3 and CLK4 have a phase difference between each other.

For example, if the gate driving unit shown in FIG. 7 is exemplarily regarded as the gate driving unit GD1_L1 shown in FIG. 3, the driving transistors M1, M2, M14 and M15 are configured for receiving the clock signals CLK1, CLK2, CLK3 and CLK4 respectively and outputting the clock signals CLK1, CLK2, CLK3 and CLK4 as the scan signals G1, G3, G5 and G7 respectively in accordance with the control signal CS.

Similarly, the boost circuit 420 shown in FIG. 7 includes a capacitor C1, and the capacitor C1 shown in FIG. 7 has a first terminal and a second terminal, in which the first terminal of the capacitor is electrically connected to the second terminal, which is connected to the voltage stabilizing circuit 440b, of the output transistor M3, and the second terminal (that is, the node Q) of the capacitor C1 is electrically connected to the control terminals of the output transistor M3 and the driving transistors M1, M2, M14 and M15, and in which the capacitor C1 may be configured for storing a voltage corresponding to a level of the control signal CS, such that the voltage level of the node Q may be first increased up to a certain voltage level by the stored voltage in the capacitor C1 according to the control signal CS in order that the ON-state of the driving transistors M1, M2, M14, M15 and the output transistor M3 might be enhanced.

In the present embodiment, the capacitor C1 has a capacitance larger than a parasitic capacitance of each of the driving transistors M1, M2, M14 and M15. Specifically, there may exist parasitic capacitances between the control terminals and the output terminals of the driving transistors M1, M2, M14 and M15, and the capacitance of the capacitor C1 is larger than the parasitic capacitances existing in the driving transistors M1, M2, M14 and M15. Therefore, the voltage level of the node Q may be first increased up to a certain voltage level by the stored voltage in the capacitor C1, and then the voltage level of the node Q is further increased by the output transistor M3 when the clock signal CLK5 is inputted.

In addition, in comparison with FIG. 5, the voltage stabilizing circuit 440b may further include transistors M16 and M17 each configured for performing the voltage-stabilizing operations on the driving output circuit 430a respectively in accordance with the clock signal XCLK5. The transistor M16 has a first terminal, a second terminal and a control terminal, in which the control terminal of the transistor M16 is configured for receiving a clock signal XCLK5, the first terminal of the transistor M16 is connected to the second terminal, which is configured for outputting a scan signal G_odd2, of the driving transistor M14, and the second terminal of the transistor M16 is connected to a reference voltage VGL. The transistor M17 has a first terminal, a second terminal and a control terminal, in which the control terminal of the transistor M17 is configured for receiving the clock signal XCLK5, the first terminal of the transistor M17 is connected to the second terminal, which is configured for outputting a scan signal G_even2, of the driving transistor M15, and the second terminal of the transistor M16 is connected to the reference voltage VGL.

Moreover, the voltage stabilizing circuit 440b in the present embodiment may further include transistors M18 and M19. The transistor M18 has a first terminal, a second terminal and a control terminal, in which the control terminal of the transistor M18 is connected to the first terminal of the transistor M9, the first terminal of the transistor M18 is connected to the second terminal, which is configured for outputting the scan signal G_odd2, of the driving transistor M14, and the second terminal of the transistor M18 is connected to the reference voltage VGL. The transistor M19 has a first terminal, a second terminal and a control terminal, in which the control terminal of the transistor M19 is connected to the first terminal of the transistor M9, the first terminal of the transistor M19 is connected to the second terminal, which is configured for outputting the scan signal G_even2, of the driving transistor M15, and the second terminal of the transistor M19 is connected to the reference voltage VGL.

In practice, the foregoing transistors may be conventional transistors or thin film transistors (TFTs).

Figure 8:
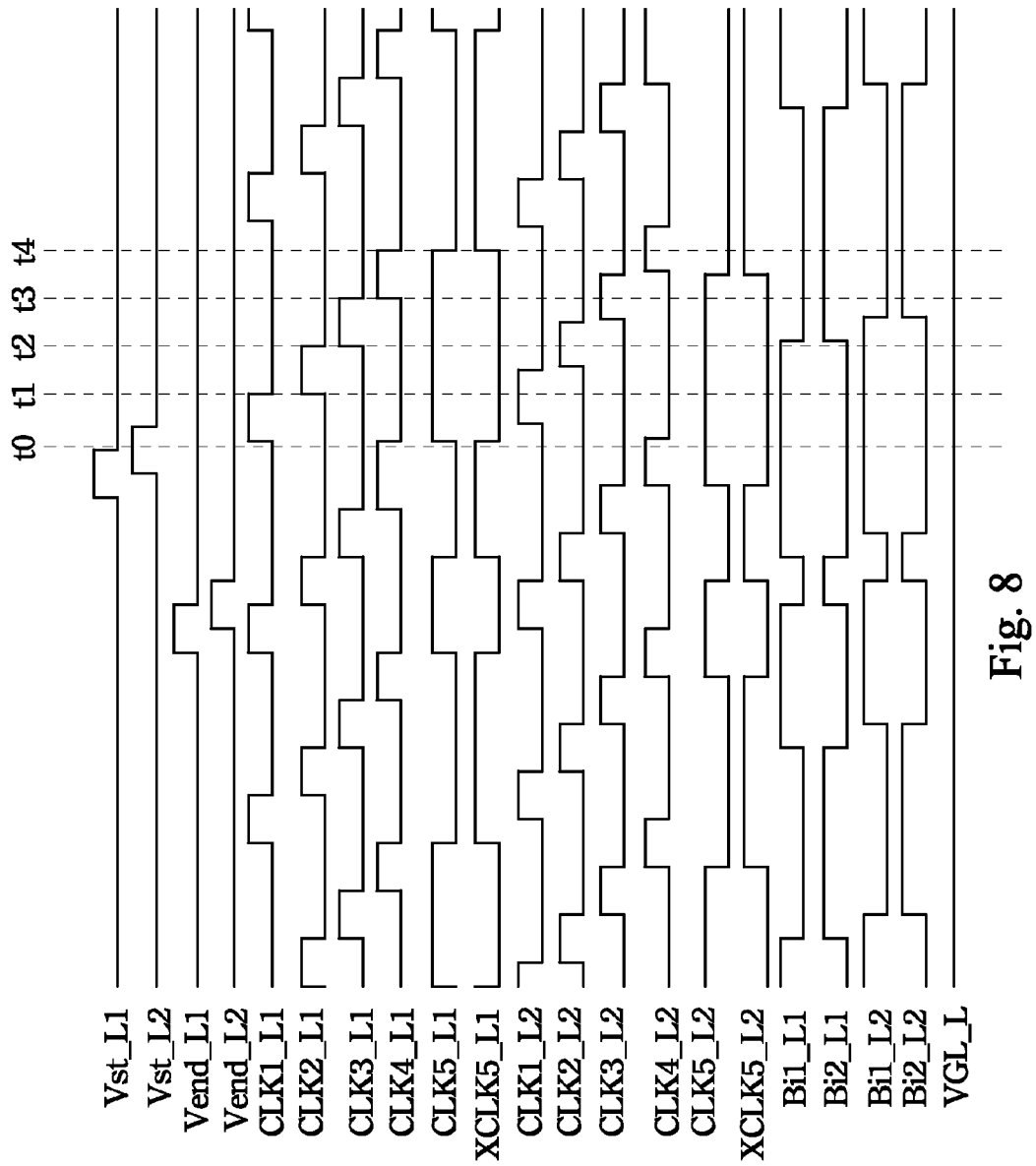
FIG. 8 schematically illustrates a timing diagram for operations of gate driving units as shown in FIG. 7 according to one embodiment of the present disclosure.

FIG. 8 schematically illustrates a timing diagram for operations of gate driving units as shown in FIG. 7 according to one embodiment of the present disclosure. In comparison with FIG. 6, the clock signal CLK5_L1 has a duty period which is a sum of duty periods of the clock signals CLK1_L1, CLK2_L1, CLK3_L1 and CLK4_L1, and the clock signal CLK5_L2 has a duty period which is a sum of duty periods of the clock signals CLK1_L2, CLK2_L2, CLK3_L2 and CLK4_L2.

Similarly, for purposes of clear and convenient illustration, the following description exemplarily shows in conjunction with the single gate driving unit shown in FIG. 7 and the timing diagram shown in FIG. 8, and the operations of the rest of the gate driving units are similar. The input signal Bi and the clock signals CLK1, CLK2, CLK3, CLK4, CLK5 and XCLK5 shown in FIG. 7 in the following description may be exemplarily regarded as the input signal Bi1_L1 and the clock signals CLK1_L1, CLK2_L1, CLK3_L1, CLK4_L1, CLK5_L1 and XCLK5_L1 shown in FIG. 8 respectively.

First, after the input signal Bi1_L1 is changed to a high level, the input signal Bi1_L1 is outputted as the control signal CS through the transistor M4 and transmitted to the transistors M3, M1, M2, M14 and M15. Meanwhile, the capacitor C1 may store a voltage corresponding to a level of the control signal CS, such that the voltage level of the node Q may be first increased up to a certain voltage level by the voltage stored in the capacitor C1 according to the control signal CS.

Then, at time t0, the clock signals CLK5_L1 and CLK1_L1 are changed to high levels, such that the voltage level of the node Q is further increased up to a higher voltage level in order that the ON-state of the transistors M3, M1, M2, M14 and M15 might be enhanced, and besides, the boosting ability of the transistor M3 is enhanced by the voltage level of the node Q. Meanwhile, the transistors M3, M1, M2, M14 and M15 are in an ON state, and the clock signal CLK5_L1 is outputted as the boost signal $SR_N$ through the transistor M3 so as to boost the next gate driving unit, and the clock signal CLK1_L1 is outputted as the scan signal G_odd1 through the transistor M1.

And then, at time t1, the clock signal CLK5_L1 still remains at the high level, and the clock signal CLK2_L1 is changed to a high level, and in the mean time, the transistor M2 still remains in the ON state, and the clock signal CLK2_L1 is outputted as the scan signal G_even1 through the transistor M2.

At time t2, the clock signal CLK5_L1 still remains at the high level, and to the clock signal CLK3_L1 is changed to a high level, and in the mean time, the transistor M14 still remains in the ON state, and the clock signal CLK3_L1 is outputted as the scan signal G_odd2l through the transistor M14.

At time t3, the clock signal CLK5_L1 still remains at the high level, and the clock signal CLK4_L1 is changed to a high level, and in the mean time, the transistor M15 still remains in the ON state, and the clock signal CLK4_L1 is outputted as the scan signal G_even2 through the transistor M14.

Then, at time t4, the clock signal XCLK5_L1 is changed to a high level, such that the transistors M6, M7, M8, M16 and M17 are turned ON according to the clock signal XCLK5_L1 in order that the terminals outputting the boost signal $SR_N$ and the scan signals G_odd1, G_even1, Godd2l and G_even2 might be decreased down to the reference voltage VGL, whereby the operations of voltage-stabilizing is completed. Similarly, the forgoing operations are shown for purposes of exemplary description, and not intended to limit the present disclosure, and without departing from the spirit and scope of the novel concepts of the present disclosure, persons skilled in the art can modify the clock signals in FIG. 8 according to the practical needs, such that gate driving units may output the scan signals driving the scan lines alternately from bottom to top as shown in FIG. 2.

To be understood in the present embodiment, the boost signal and the scan signals are outputted by the corresponding transistors separately. As a result, it may be avoided that the operations of boosting the next gate driving unit and driving the scan lines interfere with each other when the boost signal and the scan signal are outputted by the same transistor (or when an output of a single transistor is used as the boost signal and the scan signal at the same time), such that the ability to drive the scan lines is declined. Therefore, the boost signal and the scan signals are outputted by the corresponding transistors separately, resulting in an enhanced driving ability to drive the scan lines and also an enhanced boosting ability to boost the next gate driving unit by the boost signal in order that interferences on boosting ability might be avoided.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A gate driver comprising a plurality of gate driving units, each of the gate driving units comprising:
    a control circuit electrically connected to a previous gate driving unit and a next gate driving unit of the gate driving units;
    a boost circuit electrically connected to the control circuit to boost the next gate driving unit;

a driving output circuit electrically connected to the boost circuit and a pixel array and configured for driving at least one scan line in the pixel array; and a voltage stabilizing circuit electrically connected to the boost circuit and the driving output circuit.

2. The gate driver as claimed in claim 1, wherein the driving output circuit comprises:

a plurality of driving transistors each having a first terminal, a second terminal and a control terminal, wherein the first terminals of the driving transistors are configured for receiving different clock signals, respectively, and the second terminals of the driving transistors are connected to a plurality of scan lines in the pixel array, respectively.

3. The gate driver as claimed in claim 2, wherein the driving transistors comprise:

a first driving transistor having a first terminal, a second terminal and a control terminal, wherein the first terminal of the first driving transistor is configured for receiving a first clock signal, and the second terminal of the first driving transistor is connected to a first scan line of the scan lines; and a second driving transistor having a first terminal, a second terminal and a control terminal, wherein the first terminal of the second driving transistor is configured for receiving a second clock signal, and the second terminal of the second driving transistor is connected to a second scan line of the scan lines.

4. The gate driver as claimed in claim 3, wherein the boost circuit comprises:

an output transistor having a first terminal, a second terminal and a control terminal, wherein the first terminal of the output transistor is configured for receiving a third clock signal, the second terminal of the output transistor is connected to the control circuit of the next gate driving unit, and the control terminal of the output transistor is connected to the control terminals of the driving transistors; and a capacitor having a first terminal and a second terminal, wherein the first terminal of the capacitor is electrically connected to the second terminal of the output transistor, and the second terminal of the capacitor is electrically connected to the control terminals of the driving transistors.

5. The gate driver as claimed in claim 4, wherein the capacitor has a capacitance larger than a parasitic capacitance of each of the first driving transistor and the second driving transistor.

6. The gate driver as claimed in claim 4, wherein the control circuit comprises:

a first control transistor having a first terminal, a second terminal and a control terminal, wherein the first terminal of the first control transistor is configured for receiving an input signal, the second terminal of the first control transistor is connected to the control terminal of the output transistor, and the control terminal of the first control transistor is connected to the previous gate driving unit; and a second control transistor having a first terminal, a second terminal and a control terminal, wherein the first terminal of the second control transistor is configured for receiving the input signal, the second terminal of the second control transistor is connected to the control terminal of the output transistor, and the control terminal of the second control transistor is connected to the next gate driving unit.

7. The gate driver as claimed in claim 6, wherein the voltage stabilizing circuit comprises:

a first transistor having a first terminal, a second terminal and a control terminal, wherein the first terminal of the first transistor is connected to the second terminal of the first driving transistor, the second terminal of the first transistor is connected to a reference voltage, and the control terminal of the first transistor is configured for receiving a fourth clock signal; and a second transistor having a first terminal, a second terminal and a control terminal, wherein the first terminal of the second transistor is connected to the second terminal of the second driving transistor, the second terminal of the second transistor is connected to the reference voltage, and the control terminal of the second transistor is configured for receiving the fourth clock signal.

8. The gate driver as claimed in claim 2, wherein the driving transistors comprise:

a first driving transistor having a first terminal, a second terminal and a control terminal, wherein the first terminal of the first driving transistor is configured for receiving a first clock signal, and the second terminal of the first driving transistor is connected to a first scan line of the scan lines;

a second driving transistor having a first terminal, a second terminal and a control terminal, wherein the first terminal of the second driving transistor is configured for receiving a second clock signal, and the second terminal of the second driving transistor is connected to a second scan line of the scan lines;

a third driving transistor having a first terminal, a second terminal and a control terminal, wherein the first terminal of the third driving transistor is configured for receiving a third clock signal, and the second terminal of the third driving transistor is connected to a third scan line of the scan lines; and a fourth driving transistor having a first terminal, a second terminal and a control terminal, wherein the first terminal of the fourth driving transistor is configured for receiving a fourth clock signal and the second terminal of the fourth driving transistor is connected to a fourth scan line of the scan lines;

wherein the first clock signal, the second clock signal, the third clock signal and the fourth clock signal have a phase difference between each other.

9. The gate driver as claimed in claim 8, wherein the boost circuit comprises:

an output transistor having a first terminal, a second terminal and a control terminal, wherein the first terminal of the output transistor is configured for receiving a fifth clock signal, the second terminal of the output transistor is connected to the control circuit of the next gate driving unit, and the control terminal of the output transistor is connected to the control terminals of the driving transistors, wherein the fifth clock signal has a duty period which is a sum of duty periods of the first clock signal, the second clock signal, the third clock signal and the fourth clock signal; and a capacitor having a first terminal and a second terminal, wherein the first terminal of the capacitor is electrically connected to the second terminal of the output transistor, and the second terminal of the capacitor is electrically connected to the control terminals of the driving transistors.

10. The gate driver as claimed in claim 9, wherein the capacitor has a capacitance larger than a parasitic capacitance of each of the first driving transistor, the second driving transistor, the third driving transistor and the fourth driving transistor.

11. The gate driver as claimed in claim 9, wherein the voltage stabilizing circuit comprises:
a first transistor having a first terminal, a second terminal and a control terminal, wherein the first terminal of the first transistor is connected to the second terminal of the first driving transistor, the second terminal of the first transistor is connected to a reference voltage, and the control terminal of the first transistor is configured for receiving a sixth clock signal wherein the fifth clock signal has a phase opposite to a phase of the sixth clock signal;
a second transistor having a first terminal, a second terminal and a control terminal, wherein the first terminal of the second transistor is connected to the second terminal of the second driving transistor, the second terminal of the second transistor is connected to the reference voltage, and the control terminal of the second transistor is configured for receiving the sixth clock signal;
a third transistor having a first terminal, a second terminal and a control terminal, wherein the first terminal of the third transistor is connected to the second terminal of the third driving transistor, the second terminal of the third transistor is connected to the reference voltage, and the control terminal of the third transistor is configured for receiving the sixth clock signal; and
a fourth transistor having a first terminal, a second terminal and a control terminal, wherein the first terminal of the fourth transistor is connected to the second terminal of the fourth driving transistor, the second terminal of the fourth transistor is connected to the reference voltage, and the control terminal of the fourth transistor is configured for receiving the sixth clock signal.

12. A display, comprising:
a plurality of data lines;
a plurality of scan lines interlacing with the data lines; and
a gate driver coupled to the scan lines and configured for sequentially driving the scan lines, wherein the gate driver comprises a plurality of gate driving units, each of the gate driving units comprising:
a control circuit electrically connected to a previous gate driving unit and a next gate driving unit of the gate driving units and configured for generating a control signal;
a boost circuit electrically connected to the control circuit and configured for generating a boost signal and transmitting the boost signal to the previous gate driving unit and the next gate driving unit in accordance with the control signal and a first clock signal; and
a driving output circuit electrically connected to the boost circuit and at least one scan line of the scan lines and configured for generating at least a scan signal in accordance with the control signal to drive at least a corresponding scan line of the scan lines,
wherein the driving output circuit comprises:
a first driving transistor which is configured for receiving a second clock signal and outputting the second clock signal as a first scan signal in accordance with the control signal; and
a second driving transistor which is configured for receiving a third clock signal and outputting the third clock signal as a second scan signal in accordance with the control signal;
wherein the second clock signal and the third clock signal have a phase difference between each other.

13. The display as claimed in claim 12, wherein the boost circuit comprises:
an output transistor which is configured for receiving the first clock signal and outputting the first clock signal as the boost signal to boost the next gate driving unit in accordance with the control signal, wherein the first clock signal has a duty period which is a sum of duty periods of the second clock signal and the third clock signal; and
a capacitor electrically connected between a control terminal and a first terminal of the output transistor and configured for storing a voltage corresponding to the control signal.

14. The display as claimed in claim 13, wherein the capacitor has a capacitance larger than a parasitic capacitance of each of the first driving transistor and the second driving transistor.

15. The display as claimed in claim 12, wherein the driving output circuit further comprises:
a first driving transistor which is configured for receiving a second clock signal and outputting the second clock signal as a first scan signal in accordance with the control signal;
a second driving transistor which is configured for receiving a third clock signal and outputting the third clock signal as a second scan signal in accordance with the control signal;
a third driving transistor which is configured for receiving a fourth clock signal and outputting the fourth clock signal as a third scan signal in accordance with the control signal; and
a fourth driving transistor which is configured for receiving a fifth clock signal and outputting the fifth clock signal as a fourth scan signal in accordance with the control signal;
wherein the second clock signal, the third clock signal, the fourth clock signal and the fifth clock signal have a phase difference between each other.

16. The display as claimed in claim 15, wherein the boost circuit comprises:
an output transistor which is configured for receiving the first clock signal and outputting the first clock signal as the boost signal to boost the next gate driving unit in accordance with the control signal, wherein the first clock signal has a duty period which is a sum of duty periods of the second clock signal, the third clock signal, the fourth clock signal and the fifth clock signal; and
a capacitor electrically connected between a control terminal and a first terminal of the output transistor and configured for storing a voltage corresponding to the control signal.

17. The display as claimed in claim 16, wherein the capacitor has a capacitance larger than a parasitic capacitance of each of the first driving transistor, the second driving transistor, the third driving transistor and the fourth driving transistor.

* * * * *